United States Patent
Singh et al.

(10) Patent No.: US 7,097,801 B2
(45) Date of Patent: Aug. 29, 2006

(54) METHOD OF MAKING AN INTEGRATED MOLD PRODUCT

(75) Inventors: Harvinder Singh, Shelby Township, MI (US); Donald Hanson, Novi, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 318 days.

(21) Appl. No.: 10/187,828

(22) Filed: Jul. 2, 2002

(65) Prior Publication Data

US 2004/0003908 A1 Jan. 8, 2004

(51) Int. Cl.
*B22C 9/10* (2006.01)
*B22C 9/20* (2006.01)
*B28B 7/26* (2006.01)
*B22C 39/26* (2006.01)

(52) U.S. Cl. .................. 264/255; 164/15; 164/526; 164/108

(58) Field of Classification Search ................ 264/34, 264/46.5, 46.7, 401, 255; 29/DIG. 8; 164/131, 164/6, 11, 15, 17, 24, 28, 33, 40, 526, 69.1, 164/109, 111, 231, 14, 18, 23, 94, 108, 246, 164/521
See application file for complete search history.

(56) References Cited

U.S. PATENT DOCUMENTS

| | | | |
|---|---|---|---|
| 3,889,363 A | 6/1975 | Davis | |
| 3,935,358 A * | 1/1976 | Wyeth et al. | ............... 428/166 |
| 4,029,454 A | 6/1977 | Monnet | |
| 4,368,168 A | 1/1983 | Slepcevic | |
| 4,469,309 A * | 9/1984 | Takashima et al. | ........... 266/44 |
| 4,785,523 A | 11/1988 | Koseki et al. | |
| 5,189,781 A | 3/1993 | Weiss et al. | |
| 5,278,442 A | 1/1994 | Prinz et al. | |
| 5,355,933 A * | 10/1994 | Voss | ........................... 164/120 |
| 5,566,742 A * | 10/1996 | Nemoto | ..................... 164/132 |
| 5,695,791 A | 12/1997 | Baumann et al. | |
| 5,725,044 A * | 3/1998 | Hirokawa | ................... 164/131 |
| 5,730,204 A | 3/1998 | Shimmell | |
| 5,842,265 A | 12/1998 | Rink | |
| 5,922,264 A | 7/1999 | Shimmell | |
| 5,997,795 A * | 12/1999 | Danforth et al. | ............ 264/401 |
| 6,042,780 A | 3/2000 | Huang | |
| 6,045,732 A | 4/2000 | Nakatsuji et al. | |
| 6,120,714 A | 9/2000 | Allan et al. | |
| 6,222,519 B1 | 4/2001 | Harris | |
| 6,342,170 B1 | 1/2002 | Yang | |
| 6,348,535 B1 | 2/2002 | Sugimoto et al. | |
| 6,355,211 B1 | 3/2002 | Huang | |
| 6,391,251 B1 | 5/2002 | Keicher et al. | |

* cited by examiner

*Primary Examiner*—Michael P. Colaianni
*Assistant Examiner*—Matthew J Daniels
(74) *Attorney, Agent, or Firm*—Brinks Hofer Gilson & Lione

(57) ABSTRACT

The present invention involves a method of making an integrated mold product with a molding tool. The method includes introducing polymeric material in the molding tool and molding the polymeric material to define an outer layer in the mold. The outer layer has a channel formed thereon. The method further includes introducing molten metal in the channel of the outer layer when the outer layer is at about the same temperature as the molding tool and cooling the molten metal in the channel to define a metal insert in the channel of the outer layer for electrical and thermal conductivity, structural support, and electromagnetic shielding.

10 Claims, 2 Drawing Sheets

METHOD OF MAKING AN INTEGRATED MOLD PRODUCT

BACKGROUND OF THE INVENTION

The present invention is related to integrated molding products and methods of making integrated products with a molding tool.

Molding processes, such as injection molding and multiple shot molding, have been widely used in several industries. In the automotive industry, numerous vehicle parts may be made by such molding processes. For example, vehicle interior panels, circuit boards, and power distribution boxes may be made by such molding processes.

Manufacturers in the automotive industry have been challenged in providing improved cost effective and time saving ways of producing plastic-metal composite products made by such molding processes. In many situations, plastic-metal composite products are used in vehicles for electrical connectivity between electronic devices. Currently, vehicle plastic-metal composite parts that are made by a molding process require a relatively high amount of energy to maintain metal in a molten state during the molding process. In many situations, these molding processes are relatively expensive due to the relatively large amount of heat required to be applied on the molding tool to maintain the metal in a molten state.

BRIEF SUMMARY OF THE INVENTION

One aspect of the present invention includes an improved method of making an integrated mold product with a molding tool, wherein the integrated mold product is a plastic-metal composite. One method of the present invention comprises forming an outer layer made of polymeric material. The outer layer has a contact surface and an open surface, wherein the contact surface contacts a first mold core of the molding tool and the open layer contacts a second mold core of the molding tool. The open layer takes on a shape corresponding to the second mold core and the contact surface takes on a shape corresponding to the first mold core of the molding tool. The open surface includes a channel formed thereon.

The method further includes introducing molten metal in the channel of the outer layer when the outer layer is at about the same temperature as the mold. Relative to heat applied on the mold tool to form the outer layer, no additional heat is needed to maintain the molten metal in a molten state when the molten metal is introduced in the channel. Thus, the molten metal remains fluid when introduced in the channel of the outer layer without additional heat thereby providing an energy savings. Then, the method includes cooling the molten metal in the channel to define a metal insert in the channel of the outer layer for electrical conductivity.

The present invention allows molten metal to remain molten without substantial solidification as it is introduced in the channel of the outer layer. The method requires no additional heat on the molding tool relative to the outer layer. As a result, energy which typically would be applied on the molding tool is saved along with cycle time of the molding process.

Further objects, features and advantages of the invention will become apparent from consideration of the following description and the appended claims when taken in connection with the accompanying drawings.

DETAILED DESCRIPTION OF THE INVENTION

Figure 1:
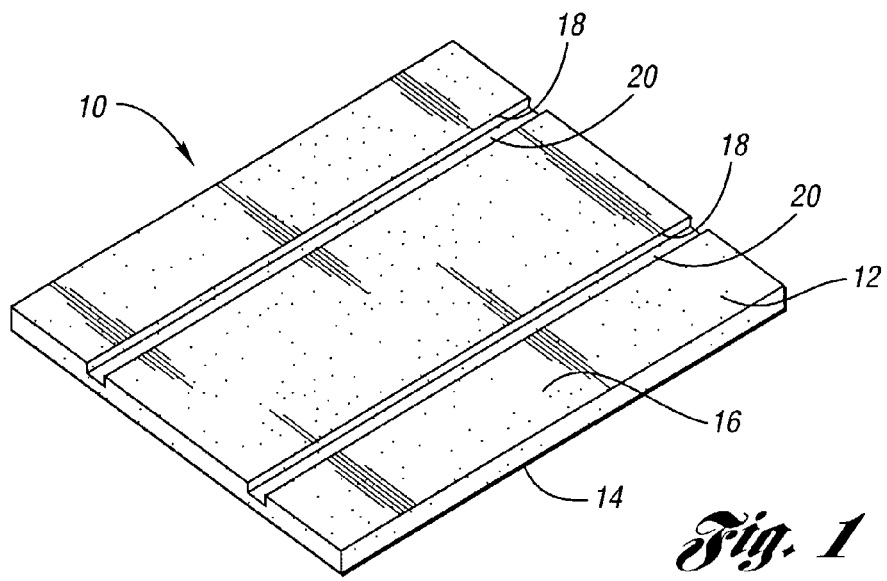
FIG. 1 illustrates a perspective view of a single-layered integrated mold product in accordance with one embodiment of the present invention.

FIG. 1 illustrates a single-layered integrated mold product indicated by reference numeral 10 in accordance with one embodiment of the present invention. As shown, integrated mold product 10 may be implemented for any product or part used in a vehicle for conducting electric current within a vehicle or for allowing electric connectivity between electronic devices. For example, integrated mold product 10 may be implemented as a printed circuit board, a power distribution box, or an electrical connector disposed within a vehicle for electric connectivity.

As shown, integrated mold product 10 is a plastic-metal composite. It is to be understood that plastic materials and metal of the integrated mold product 10 are adhered to each other by a molding process which may include single-shot molding, multiple-shot molding, and injection molding, or any other suitable molding process known in the art.

As shown, single-layered integrated mold product 10 includes a plastic outer layer 12 having a contact surface 14 and an open surface 16. Open surface 16 has channels 18 formed thereon. As shown, metal insert 20 is disposed in channel 18. Outer layer 12 is made of polymeric material formed in a molding tool having a complementing configuration to open surface 16 to form channels 18. A metal insert 20 adheres to the polymeric material of the outer layer during the molding process of mold product 10, as will be described in greater detail below.

The polymeric material may be any suitable polymer known in the art. This may include, but is not limited to, polypropylene, polyethylene, and polycarbonate. The metal may include any suitable metal capable of conducting electrical current therethrough. This may include tin, aluminum, steel, other suitable metals, and alloys thereof.

Figure 2:
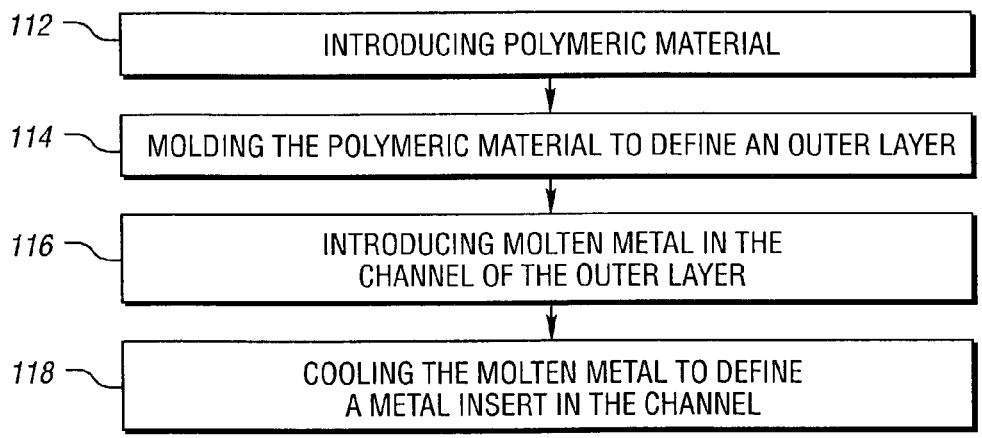
FIG. 2 is a flow chart depicting one general method of making the integrated mold product shown in FIG. 1.

FIG. 2 depicts one method 110 of making an integrated mold product with a molding tool as in the mold product of FIG. 1. The molding tool may include a plurality of mold cores which may move relative to each other defining cavities in which the polymeric material and the metal are introduced to form a plastic-metal integrated mold product. Thus, the molding tool may be a multiple shot molding apparatus, such as a two-shot or five-shot molding apparatus as known in the art.

The polymeric material such as polyethylene, polypropylene, or polycarbonate is introduced in a first cavity defined by first and second mold cores of the molding tool in box 112. This may be accomplished by any suitable means known in the art, such as injecting the polymeric material in the first cavity at about 2,000–3,000 pounds per square inch gauge (psig). In this embodiment, the polymeric material is at a temperature ranging between about 100° Celsius and 260° Celsius. This molds the polymeric material in the first cavity of the molding tool to define an outer layer of the mold product in box 114. In this embodiment, the outer layer 12 includes a contact surface 14 which engages the first mold core and an open surface 16 which engages the second mold core of the molding tool. In this embodiment, the first and second mold cores engage the contact and open surfaces, respectively, to define a desired configuration and geometry of the outer layer 12. The open surface 16 includes a channel 18 formed thereon by the configurations of the first and second mold cores. After cooling, the second mold core is moved relative to the first mold core to define a second mold cavity of the molding tool.

It is to be understood that other means may be used to create the second mold cavity, such as removable inserts attached to the second mold core and disposed in the channel to be removed therefrom during the molding process. Such means do not fall beyond the scope or spirit of the present invention.

Next, molten metal, at about 505° Fahrenheit (F.), is introduced in the channel 18 of the outer layer 12 when the outer layer is at about the same temperature as the molding tool in box 116. In this embodiment, the molten metal is injected into the channel at a relatively low pressure which may be, but not limited to, about 100 psig. In this embodiment, the second mold core has a polymeric skin attached thereto for contact with the open surface. This allows insulation of the molten metal from the second mold core to lessen solidification of the metal and maintain the metal in its molten state. The polymeric skin may be any suitable polymeric material such as Teflon™.

It has been determined that, due to a very low heat transfer index of selected polymeric material, the polymeric material may be used in the present invention as a thermal barrier to allow the metal to flow within the channel without substantial solidification. The polymeric material serves as a thermal barrier to insulate heat of the molten metal within the channel. Thus, no additional heating is required to be applied on the molding tool when the molten metal is introduced in the channel.

In this embodiment, the molten metal is maintained in a fluid or molten state to allow it to flow along the channel filling the channel. It has been determined that the outer layer which is made of polymeric material serves to insulate the molten metal from the molding tool preventing substantial solidification of the molten metal. Thus, no additional heat relative to the outer layer 12 is required to be applied on the molding tool to maintain the molten metal in a molten state.

Method 110 further includes cooling the molten metal in the channel to define a metal insert in the channel of the outer layer for electrical conductivity in box 118. The step of cooling includes about one minute of cooling the metal at ambient temperature.

Figure 3:
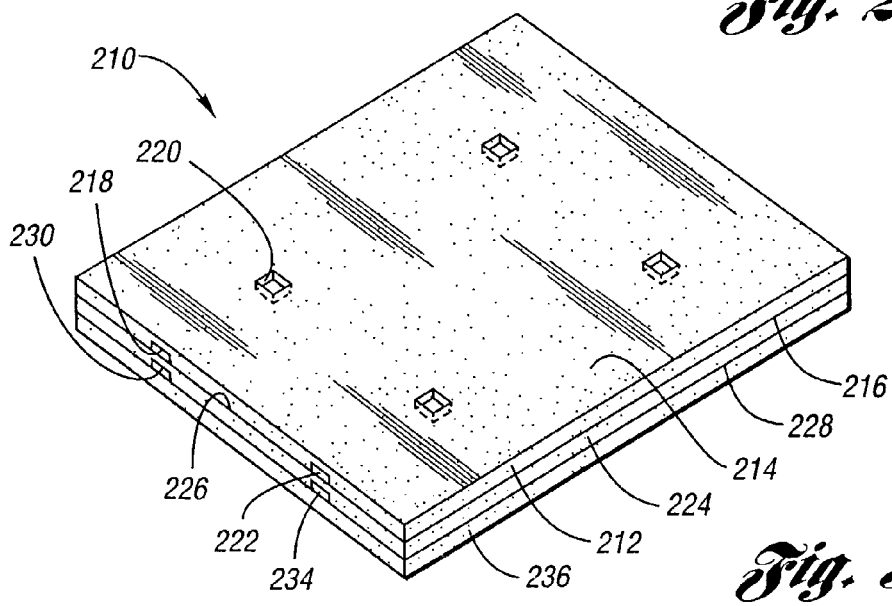
FIG. 3 is a perspective view of a multi-layered integrated mold product in accordance with another embodiment of the present invention.
Figure 4:
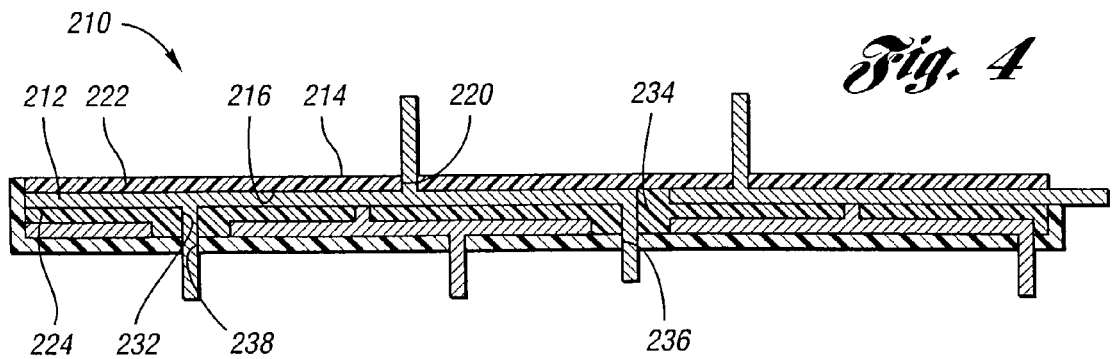
FIG. 4 is a cross-sectional view of the multi-layered integrated mold product in FIG. 3 taken along lines 4—4.

FIG. 3 illustrates a multi-layered integrated mold product 210 in accordance with one embodiment of the present invention. As shown in FIGS. 3 and 4, mold product 210 includes an outer layer 212 having first contact surface 214 and first open surface 216. The first open surface 216 includes first channels 218 formed thereon. Outer layer 212 further includes first apertures 220 formed therethrough. As shown, first metal insert 222 is disposed along first channels 218 and through first apertures 220.

A middle layer 224 is shown to be in contact with first open surface 216 to insulate the first metal insert 222 within the first channel 218. This conductively insulates the first metal insert from undesired contact with other external parts. The middle layer 224 is made of polymeric material including, but not limited to, polypropylene, polyethylene, and polycarbonate. As shown, middle layer 224 includes second contact surface 226 and second open surface 228 wherein second contact surface 226 engages with first open surface 216. Moreover, second open surface 228 includes second channels 230 formed thereon. Middle layer further includes second apertures 232 formed therethrough. As shown, second metal inserts 234 are disposed in second channels 230 and through second apertures 232 so that second metal inserts 234 are in electrical communication with first metal inserts 222. This allows electrical conductivity across first and second metal inserts 222, 234.

As shown, cover layer 236 adheres to second open surface 228 so that second metal inserts 234 are insulated from other conductive material or other external materials.

Figure 5:
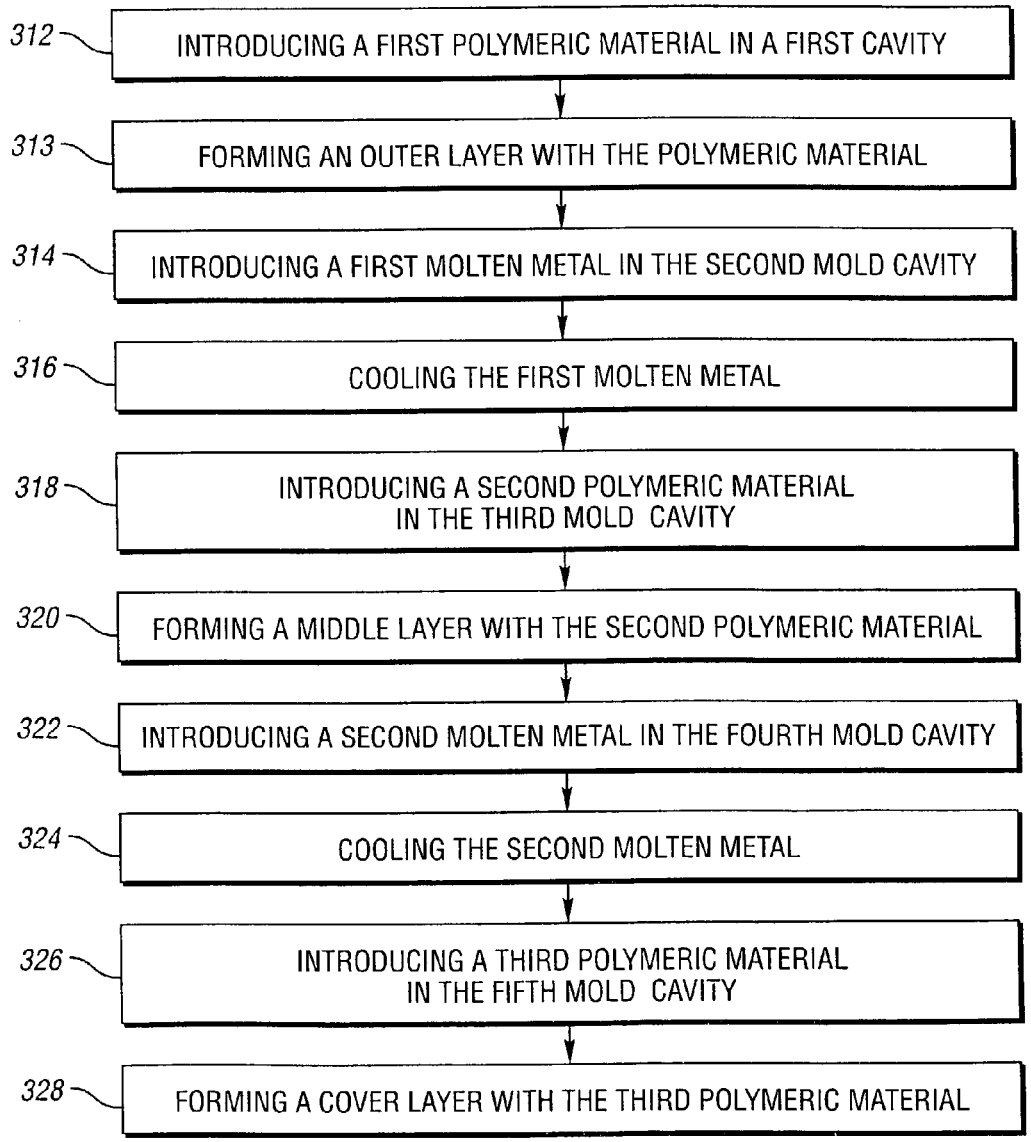
FIG. 5 is another flow chart depicting one method of making the integrated mold product in FIG. 3 in accordance with the present invention.

FIG. 5 depicts one method 310 of making the integrated mold product described above with a molding tool. A first polymeric material is introduced in a first cavity of a molding tool in box 312. In this embodiment, the first cavity is defined by first and second mold cores of a multiple shot molding apparatus. The first polymeric material may be injection molded in the first cavity. In this embodiment, the polymeric material may be injected at about 12,000–45,000 psig. The first polymeric material is at a temperature range of between about 100° Celsius and 260° Celsius.

The polymeric material is molded to form an outer layer of the mold product in box 313. The outer layer has a first contact surface and a first open surface opposite the first contact surface. In this embodiment, the first contact surface engages the first mold core and the first open surface engages the second mold core when the outer layer is formed. In this embodiment, the second mold core has a polymeric skin attached thereto for contact with the first open surface. This allows insulation of molten metal (discussed below) from the second mold core to lessen solidification of the metal and to maintain the metal in its molten state. The polymeric skin may be any suitable polymeric material such as Teflon™.

The first contact surface and the first open surface both take on the surface configurations and geometries of the first mold core and the second mold core, respectively, during formation of the outer layer. In this embodiment, the first open surface has a first channel formed thereon based on the configurations of the first and second mold cores. Moreover, the outer layer includes apertures formed therethrough.

Then, the second mold core is moved relative to the first mold core to define a second mold cavity. In this embodiment, the second mold core may move away from the first mold core to define the second mold cavity in which molten metal may be introduced. Alternatively, the second mold cavity may be defined by removable inserts attached to the second mold core and disposed within each of the second channels. Other means for defining the second cavity do not fall beyond the scope or spirit of the present invention.

Then, a first molten metal is introduced in the second mold cavity within the first channel of the outer layer in box 314. Preferably, the molten metal is at a temperature of about 505° Fahrenheit. The first molten metal is introduced therein when the outer layer is at about the same temperature as the first and second mold cores for insulating the first molten metal from the molding tool. As mentioned above in the first embodiment, the polymeric skin and the polymeric material serve to insulate the heat of the molten metal within the first channel to maintain the metal in a molten state as it is introduced in the first channel. Thus, no additional heat is required to be applied to the molding tool to maintain the first molten metal in a molten state.

It has been determined that due to the relatively low heat transfer index of the polymeric material and polymeric skin used, the first molten metal is insulated from the first and second mold cores so that it may flow in its molten state in the first channel without substantial solidification. Then, the first molten metal is cooled in the first channel defining a first metal insert in the first channel in box 316. Preferably, cooling the molten metal includes about one minute of cooling at ambient temperature or any other temperature below the solidification temperature of the metal.

In this embodiment, the second mold core is moved relative to the first mold core to define a third mold cavity. This may be accomplished by any suitable means known in the art of multiple shot molding. For example, in this embodiment, the second mold core may move from the first mold core defining the third mold cavity. Alternatively, the second mold core may rotate to allow a third mold core to cooperate with the outer layer defining the third mold cavity. It is to be understood that different ways of operating a multiple shot molding process to define the third mold cavity does not fall beyond the scope or spirit of the present invention.

Then, a second polymeric material is introduced in the third mold cavity in box 318. As in introducing the first polymeric material in the first mold cavity, this may be accomplished by injecting the second polymeric material in the third mold cavity at about 12,000–45,000 psig. In this embodiment, the second polymeric material is injected in the third mold cavity and engages the first open surface of the outer layer and the second mold core.

As a result, a middle layer is formed with the second polymeric material in the third mold cavity in box 320. The middle layer takes on a complementing configuration of the third mold cavity defined by the configurations of the first open surface and the second mold core. The middle layer has a second contact surface which engages the first open surface and insulates the first metal insert. The middle layer further has a second open surface on which a second channel is formed. The second open surface is based on the configuration and geometry of the second mold core.

The second mold core then retracts from the middle layer to define a fourth mold cavity. In this embodiment, the second mold core moves away from the middle layer to define the fourth mold cavity within the second channel. Alternatively, the second mold core may rotate to allow a fourth mold core to cooperate with the middle layer to define the fourth mold cavity. It is to be understood that different ways of operating a multiple-shot molding process to define the fourth mold cavity does not fall beyond the scope or spirit of the present invention.

Then, a second molten metal is introduced in the fourth mold cavity in box 322. The second polymeric material and the polymeric skin serve to insulate the second molten metal so that the second molten metal may be maintained in its molten state when introduced in the second channel. Moreover, the second molten metal is disposed through the second apertures and contacts the first metal insert for electrical and thermal connectivity therebetween.

In this embodiment, the method further includes cooling the second molten metal in the second channel to define a second metal insert for electrical and thermal conductivity in box 324. In this embodiment, the second metal insert is in electrical communication with the first metal insert by way of the first and second apertures formed through the outer and middle layers, respectively. It is to be understood that the first and second metal inserts may also be used for structural support and electromagnetic shielding.

Then, the second mold core is moved relative to the first mold core and in cooperation therewith to define a fifth mold cavity. Other ways of defining the fifth mold cavity do not fall beyond the scope or spirit of the present invention. A third polymeric material is introduced in the fifth mold cavity of the molding tool in box 326. This may be accomplished by injecting the third polymeric material in the fifth mold cavity at about 12,000–45,000 psig. This forms a cover layer with the third polymeric material in box 328. The cover layer has a third contact surface which contacts the second open surface to insulate the second metal insert. The cover layer also includes an outer surface, opposite the second molten metal, which engages the second mold core. In this embodiment, the cover layer includes third apertures formed therethrough to allow electrical communication with the second metal insert.

It is to be noted that other configurations may be used so long as the polymeric material is used to insulate the heat of molten metal from a mold core saving energy to heat the molding tool.

While the present invention has been described in terms of preferred embodiments, it will be understood, of course, that the invention is not limited thereto since modifications may be made to those skilled in the art, particularly in light of the foregoing teachings.

The invention claimed is:

1. A method of making an integrated mold product with a molding tool, the method comprising:

introducing a polymeric material in a mold cavity at between about 2,000 and 3,000 pounds per square inch gauge (psig) defined by first and second mold cores of a molding tool, the second mold core having a polymeric skin for insulation;

moving the second mold core relative to the first mold core;

moving one of the first and second mold cores relative to the other mold core to form a polymeric outer layer with the polymeric material in the molding tool, the outer layer having an engaging surface contacting the first mold core and an open surface having a channel formed thereon;

introducing molten metal in the channel of the outer layer when the outer layer is at about the same temperature as the molding tool to insulate the molten metal from the first mold core; and cooling the molten metal in the channel to define a metal insert in the channel for electrical conductivity thereacross;

introducing a second polymeric material in the molding tool at between about 12,000 and 45,000 psig, after cooling the first molten metal;

forming a middle layer with the second polymeric material in the molding tool, the middle layer having a second contact surface engaging the first open surface to insulate the first metal insert and a second open surface on which a second channel is formed;

introducing a second molten metal in the second channel of the middle layer for insulating the second molten metal within the second channel from the molding tool;

cooling the second molten metal in the second channel to define a second metal insert for electrical conductivity;

introducing a third polymeric material in the molding tool at between about 12,000 and 45,000 psig;

forming a cover layer with the third polymeric material in the mold tool, the cover layer having a third contact surface contacting the second open surface to insulate the second metal insert and an outer surface opposite the second molten metal.

2. A method of making an integrated mold product with a molding tool, the method comprising:

introducing a first polymeric material in a first mold cavity of a first mold core at between about 2,000 and 3,000 pounds per square inch gauge (psig) of the molding tool;

forming an outer layer with the first polymeric material in the molding tool, the outer layer having a first contact surface engaging the first mold core and a first open surface having a first channel formed thereon;

introducing a first molten metal in the first channel on the first open surface of the outer layer when the outer layer is at about the same temperature as the first mold core for insulating the first molten metal in the first channel; and cooling the first molten metal in the first channel to define a first metal insert in the first channel;

introducing a second polymeric material in the molding tool at between about 12,000 and 45,000 psig, after cooling the first molten metal;

forming a middle layer with the second polymeric material in the molding tool, the middle layer having a second contact surface engaging the first open surface to insulate the first metal insert and a second open surface on which a second channel is formed;

introducing a second molten metal in the second channel of the middle layer for insulating the second molten metal within the second channel from the molding tool;

cooling the second molten metal in the second channel to define a second metal insert for electrical conductivity;

introducing a third polymeric material in the molding tool at between about 12,000 and 45,000 psig;

forming a cover layer with the third polymeric material in the mold tool, the cover layer having a third contact surface contacting the second open surface to insulate the second metal insert and an outer surface opposite the second molten metal.

3. The method of claim 2 wherein the first and second metal inserts are in contact with each other for electrical communication therebetween and implemented for structural support therebetween.

4. The method of claim 2 wherein the middle layer has apertures formed therethrough so that the first and second metal inserts are connected for electrical communication therebetween.

5. The method of claim 2 wherein the molten metals are at a temperature of about 263° Celsius or about 505° Fahrenheit.

6. The method of claim 2 wherein the polymeric materials are at a temperature range of between about 100° Celsius (212° Fahrenheit) and 260° Celsius (500° Fahrenheit).

7. The method of claim 2 wherein the molten metals include tin.

8. The method of claim 2 wherein the polymeric materials include polycarbonate, polyethylene, and polypropylene.

9. The method of claim 2 wherein the step of cooling the first molten metal includes cooling for about one minute at ambient temperature.

10. The method of claim 2 wherein the step of cooling the second molten metal includes cooling for about one minute at ambient temperature.

* * * * *